United States Patent [19]
van der Plas

[11] Patent Number: 4,952,525
[45] Date of Patent: Aug. 28, 1990

[54] METHOD OF MANUFACTURING A SEMICONDUCTOR DEVICE IN WHICH A SILICON WAFER IS LOCALLY PROVIDED WITH FIELD OXIDE REGIONS

[75] Inventor: Paulus A. van der Plas, Eindhoven, Netherlands

[73] Assignee: U.S. Philips Corporation, New York, N.Y.

[21] Appl. No.: 453,092

[22] Filed: Dec. 11, 1989

Related U.S. Application Data

[63] Continuation of Ser. No. 159,818, Feb. 24, 1988, abandoned.

[30] Foreign Application Priority Data

Mar. 6, 1987 [NL] Netherlands .......................... 8700541

[51] Int. Cl.$^5$ ............................................ H01L 21/76
[52] U.S. Cl. ......................................... 437/69; 437/72; 437/228
[58] Field of Search ...................... 437/61, 69, 72, 228, 437/238; 156/643, 646

[56] References Cited

U.S. PATENT DOCUMENTS

| H204 | 2/1987 | Oh et al. | 156/648 |
|---|---|---|---|
| 3,783,047 | 1/1974 | Paffen et al. | 437/63 |
| 4,539,744 | 9/1985 | Burton | 437/69 |
| 4,612,701 | 9/1986 | Cox | 437/72 |
| 4,743,566 | 5/1988 | Bastiaens et al. | 437/70 |

FOREIGN PATENT DOCUMENTS

| 58-168264 | 10/1983 | Japan | 437/69 |
|---|---|---|---|
| 58-169929 | 10/1983 | Japan | 437/69 |

*Primary Examiner*—Olik Chaudhuri
*Attorney, Agent, or Firm*—Paul R. Miller

[57] ABSTRACT

A method of manufacturing a semiconductor device, in which on a surface (1) of a silicon wafer (2) an oxidation mask (3) is locally provided, whereupon the wafer is subjected to an oxidation treatment, in which a layer of field oxide (8) is formed. In order to compensate for thickness losses during further processing steps, a layer of field oxide (8) has to be formed having a thickness exceeding a desired isolation thickness. This initial thickness is realized according to the invention in such a manner that a layer is formed having a thickness which is larger than the initial thickness, whereupon in a plasma with reactive ions this layer is etched back to the desired initial thickness. In the layer thus formed, having the desired initial thickness, the layer of field oxide is prevented from locally being etched in an etching solution (such as the hydrofluoride solution) at a higher rate during further processing steps.

8 Claims, 3 Drawing Sheets

METHOD OF MANUFACTURING A SEMICONDUCTOR DEVICE IN WHICH A SILICON WAFER IS LOCALLY PROVIDED WITH FIELD OXIDE REGIONS

This application is a continuation of parent application U.S. Ser. No. 07/159,818, filed Feb. 24, 1988, abandoned, and all benefits of such earlier application are hereby claimed for this new Continuation.

The invention relates to a method of manufacturing a semiconductor device, in which an oxidation mask is locally provided on a surface of a silicon wafer, after which the wafer is subjected to an oxidation treatment, in which by oxidation of the part of the wafer not covered by the oxidation mask a layer of field oxide is formed having an initial thickness equal to a required isolation thickness plus an additional thickness required to compensate for the thickness losses during further processing steps.

Thus, the silicon wafer is provided at its surface with field oxide regions. These regions are particularly suitable for mutually isolating MOS transistors in integrated semiconductor circuits. Of course a certain isolation thickness is then desirable. In order to be able to realize such a desired isolation thickness, thickness losses should be taken into account, which may occur in a number of processing steps required to obtain an integrated semiconductor circuit. Therefore, a larger initial thickness must be chosen. Thickness losses of the field oxide may occur inter alia during etching processes, in which the field oxide is not protected by another layer, as is the case, for example, during the step of etching away the top layer of the oxidation mask oxidized during the oxidation treatment. This is also the case during the step of etching gate electrodes and gate oxide.

Japanese Patent Specification No. 56-93344 discloses a method of the kind mentioned in the opening paragraph, in which the wafer is locally provided with an oxidation mask of silicon oxynitride (SiON). During the oxidation treatment, which is carried out at a temperature of more than 1000° C., the layer of field oxide is formed. A surface layer of the oxidation mask is then also oxidized. After the oxidation treatment, the oxidation mask is removed in a hydrofluoride (HF) solution, the layer of field oxide then also losing part of its thickness.

It has been found that during the step of wet etching away the oxidation mask as in the known method by a (hydrofluoride solution), the field oxide formed is strongly attacked near its edge at which the silicon oxide adjoins the oxidation mask. This edge being convex before the oxidation mask was removed, it is concave after the oxidation mask is removed. If the thickness of the field oxide is reduced even further by etching during further processing steps, this may lead to the field oxide becoming inadmissibly thin near its edge. If, for example, a layer of field oxide is formed having a thickness of 650 nm, the quantity of silicon lost near the edge (over a distance of about 300 nm from the edge of the oxidation mask) during the removal of the oxidation mask is about 200 nm larger than at areas farther remote from the edge. If during following processing steps such a quantity is etched away of the layer of field oxide that an isolation thickness of 500 nm is left, this may mean that the thickness near the edge is still only about 250 nm over the distance of 300 nm and is therefore less suitable as isolation. This means a considerable loss of space, which is very undesirable more particularly with integrated semiconductor circuits having submicron dimensions.

The invention has for its object to improve the method mentioned in the opening paragraph in such a manner that a layer of field oxide of a given desired initial thickness can be obtained, which is not attacked more strongly near its edge by an etching solution, such as a hydrofluoride solution, than at areas farther remote from that edge. A layer of field oxide is therefore concerned, which can be etched homogeneously by the etching solution. As a result, an accelerated etching of parts of the layer of field oxide can be counteracted.

According to the invention, the method of the kind mentioned in the opening paragraph is for this purpose characterized in that the layer of field oxide of the initial thickness is realized so that first a layer of field oxide is formed having a thickness exceeding the initial thickness, after which the wafer is etched in a plasma with reactive ions until the layer of field oxide has reached the initial thickness.

The invention is based on the recognition of the fact that the aforementioned inhomogeneous etching of the field oxide is caused by stresses produced in the layer near its edge during the oxidation treatment. Parts of the field oxide in which these stresses are present are etched at a considerably higher rate in etching solution than parts in which no stresses are present. Further, the invention is based on the recognition of the fact that a layer of oxide in which stresses are present is etched in a plasma with reactive ions in fact at the same rate as an oxide layer in which these stresses are not present.

Due to the measures according to the invention, a layer of field oxide of a given initial thickness can be obtained, which is etched homogeneously in a solution of hydrofluoride.

It is a surprise to find that the stresses near the edge of the field oxide are present only superficially. When a layer of field oxide is grown having an additional thickness and when this additional thickness is then etched away again in a plasma with reactive ions, it can be achieved that parts of field oxide in which the stresses occur are removed, the shape of the field oxide regions not being adversely affected. When the layer of field oxide is thus reduced to the initial thickness, it is found that the layer is now further etched homogeneously in an etching solution.

If a layer of field oxide is formed having a thickness which is at least 100 nm larger than the initial thickness, it is found that, after the additional thickness has been removed by means of reactive ions, inhomogeneous etching by an etching solution no longer takes place with layers of field oxide having an initial thickness up to about 1000 nm. In practice it has been found that the additional thickness in these cases need not exceed 250 nm.

The invention will be described more fully hereinafter, by way of example, with reference to the drawing.

DETAILED DESCRIPTION OF THE INVENTION

Figure 1:
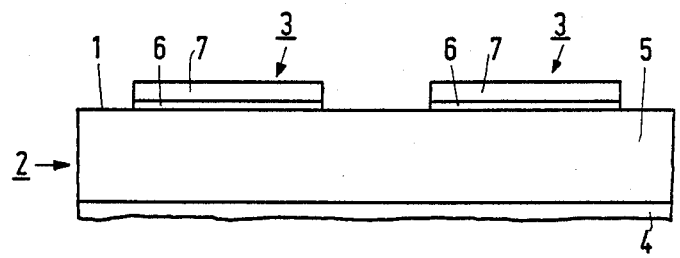
FIGS. 1 to 9 show in cross-section diagrammatically a few successive stages of manufacture of a semiconductor device by means of a method according to the invention.
Figure 2:
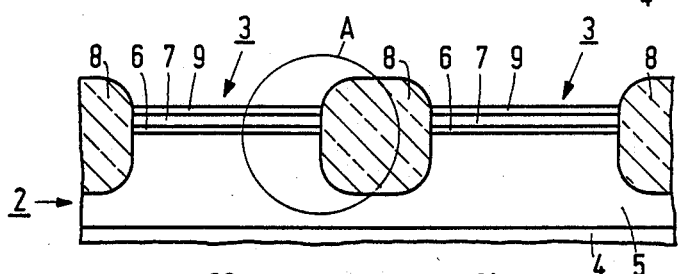

FIGS. 1 to 9 show a number of successive stages of manufacture of a semiconductor device by means of the method according to the invention. An oxidation mask 3 is locally provided on a surface 1 of a silicon wafer 2. The silicon wafer comprises a p-type underlying layer 4 having a doping concentration of about $10^{19}$ atoms per $cm^3$, on which a top layer 5, also of the p-conductivity type, but having a doping concentration of about $10^{15}$ atoms per $cm^3$ and having a thickness of about 8 $\mu m$ is epitaxially deposited. The oxidation mask 3 comprises a stress-reducing underlying layer 6 of silicon oxynitride (SiON) having a refractive index of 1.6 to 1.8 and having a thickness of about 50 nm and a top layer 7 of silicon nitride having a thickness of about 100 nm.

Subsequently, the wafer is subjected to an oxidation treatment in a usual oxidation furnace (not shown), in which the wafer 2 is heated in an oxidizing gas mixture at a temperature of about 1000° C. For example, a gas mixture comprising about 6600 scc of hydrogen and about 4200 scc of oxygen per minute is passed to the furnace. In the furnace water vapour is formed, in which in about 4 hours 800 nm of field oxide 8 is formed on the parts of the wafer 2 not covered by the oxidation mask 3. An upper part 9 of the oxidation mask 3 oxidizes also to silicon oxide.

The field oxide regions 8 in this embodiment are used as isolation zones between MOS transistors. It is of importance that they have a given isolation thickness. Since conductors, which are electrically conducting and are also current-conveying during the use of the semiconductor circuit, are provided on the field oxide regions, parasitic electrically conducting channels can be formed under the field oxide regions 8. When the field oxide regions are given a sufficient isolation thickness, the occurrence of such channels can be avoided.

As will appear below, the field oxide loses part of its thickness during a number of processing steps required for manufacturing the semiconductor device. One of the first of these steps consists in removing the layer of silicon oxide 9, which after the oxidation treatment is present on the layer of silicon nitride 7 of the oxidation mask 3. During the oxidation treatment, a layer of field oxide 8 must therefore be formed, which is thicker than the ultimately desired isolation thickness. Subsequently, this thickness—which takes into account the thickness losses occurring during processing steps required for manufacturing the semiconductor device—is designated hereinafter as the initial thickness.

Figure 10:
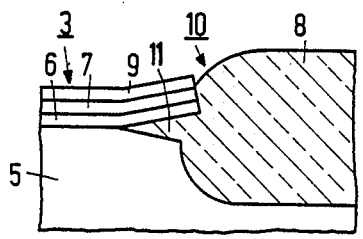
FIGS. 10 to 12 show on an enlarged scale the parts enclosed by the circles A, B and C of FIGS. 2, 3 and 5, respectively, without the use of the method according to the invention.
Figure 11:
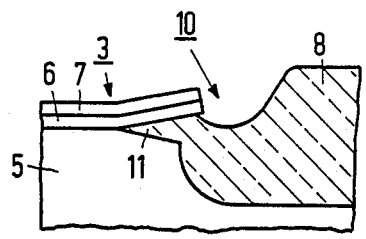
Figure 12:
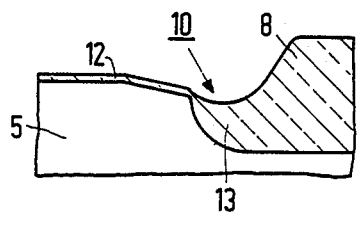

It is usual to remove the layer of silicon oxide 9 present on the oxidation mask 3 by wetting the wafer 2 with a solution of hydrofluoride. It is then found that, as indicated in FIGS. 10 and 11 (which show on an enlarged scale the part of FIG. 2 enclosed by the circle A), the field oxide is strongly attacked near its edge 10 at which the field oxide 8 adjoins the oxidation mask 3. Although this edge 10 was convex before the silicon oxide layer 9 was removed, it is concave after this layer has been removed. Subsequently, the remaining layers of silicon nitride 7 and silicon oxynitride 6 are selectively etched in a usual manner with respect to silicon oxide. The field oxide 8 has a part 11, which extends below the oxidation mask 3. If this part 11—also designated as bird's beak—is also removed, this leads to loss of field oxide. If then an approximately 20 nm. thick layer of gate oxide 12 is formed by a short heat treatment at 925° C. in oxygen, the situation indicated in FIG. 12 is obtained.

The layer of field oxide 8 originally had a thickness—the initial thickness—of 650 nm, but after the steps described a thickness—the isolation thickness—of about 500 nm remains therefrom. As is shown in FIG. 12, the layer of field oxide 8 is much thinner near its edge 10, however. At this area the field oxide has a part 13 having a width of about 300 nm, of which the thickness is only about 250 nm. This part 13 is less suitable for isolation. This means a large and undesired loss of space. The gate oxide 12 is also very thin at the area at which it passes into the field oxide 8. This is due to the fact that the silicon exhibits a sharp bend in situ.

Figure 13:
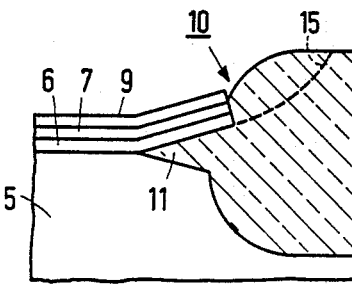
Figure 14:
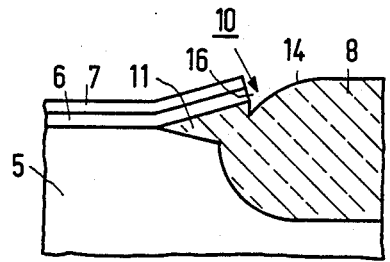

In order to avoid this loss of space, according to the invention the layer of field oxide 8 having and initial thickness is realized so that first—as is indicated in FIG. 13—a layer of field oxide 8 is formed having a thickness which is larger than the initial thickness, after which the wafer is etched in a plasma with reactive ions until the layer of field oxide—as indicated in FIG. 14—has reached the initial thickness. The oxidized layer 9 of the oxidation mask is also removed during this etching treatment.

Figure 15:
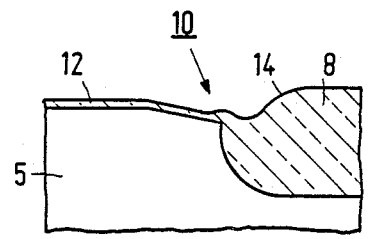
FIGS. 13 to 15 show on an enlarged scale the parts enclosed by circles A, B and C of FIGS. 2, 3 and 5, respectively, with the use of the method according to the invention.

After the layer of silicon nitride 7 and the layer of silicon oxynitride 6 have been removed from the oxidation mask 3, the field oxide 8 substantially not being attacked, and after the bird's beak 11 has been removed, a part of the field oxide 8 being also removed, the situation shown in FIG. 15 is obtained. The shape of the surface 14 of the layer of field oxide 8 as was obtained after the treatment in the plasma with reactive ions (cf. FIG. 14), is substantially maintained during the further processing steps. The thickness of the layer of field oxide 8, which is formed by means of the method according to the invention, increases much more rapidly at its edge 10 than in the manner described above (as shown in FIGS. 10, 11 and 12). This means a considerable gain in space. The structure shown in FIG. 15, which is obtained by the method according to the invention, moreover has the advantage that it is considerably flatter than that shown in FIG. 12, which is obtained in the manner indicated above.

The invention is based on the recognition of the fact that the inhomogeneous etching shown in FIG. 11 is caused by stresses produced in the layer of field oxide 8 near its edge 10 during the oxidation treatment. At the field oxide 8 formed by means of the method, such a region with stresses (bounded diagrammatically by a dotted line 15 in FIG. 13) is also formed. The invention is further based on the recognition of the fact that a layer of silicon oxide, in which stresses are present, is etched in a plasma with reactive ions at substantially the same rate as a layer of silicon oxide in which these stresses are not present. By means of the etching treatment in the plasma with reactive ions, in the method according to the invention a top layer is removed from the layer of field oxide, which top layer comprises parts with stresses and parts without stresses. When a layer of field oxide having the initial thickness is thus obtained, it can then be etched in a solution of hydrofluoride without this resulting in disadvantageous changes in shape (due to accelerated etching).

If the layer of field oxide 8 as formed during the oxidation treatment (FIG. 13) is at least 100 nm thicker than the desired initial thickness, it has been found that, after this additional thickness has been removed in a plasma with reactive ions, inhomogeneous etching with a hydrofluoride solution no longer occurs with field oxide layers having an initial thickness up to about 1000 nm. It has been found that the additional thickness then need not be larger than 250 nm.

Figure 16:
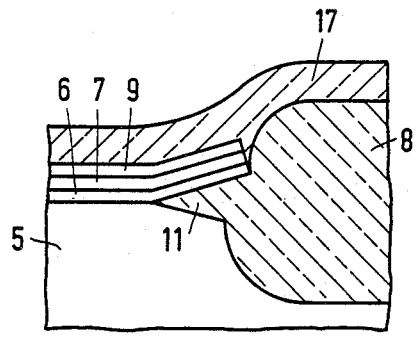
FIGS. 16 to 18 show on an enlarged scale the parts enclosed by circles A, B and C of FIGS. 2, 3 and 5, respectively, with the use of a preferred embodiment of the method according to the invention.
Figure 17:
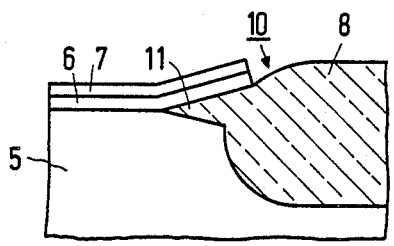
Figure 18:
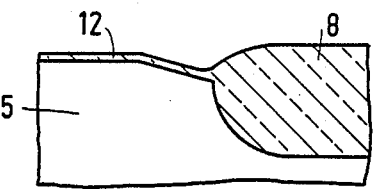

By means of the treatment with reactive ions, a gap 16 (FIG. 14) can be formed in the field oxide 8 near the edge of the oxidation mask 3 because the oxidation mask 3 and the field oxide 8 formed do not adjoin each other exactly. If this gap 16 is not too large, it practically does not influence the shape of the ultimate field oxide 8 (FIG. 15). However, the gap is comparatively large if the oxidation treatment is carried out at a temperature which is lower than 1000° C. or if an oxidation mask is used which is thicker than that described above. In these cases, the remaining field oxide also exhibits a gap, which considerably reduces the isolation thickness near the edge 10 or which can extend into the silicon. Such problems can be avoided according to the invention in that the wafer is covered after the oxidation treatment, but before the etching step in the plasma with reactive ions, with a planarizing auxiliary layer 17, which is also removed during the etching step in the plasma with reactive ions. This is shown diagrammatically in FIGS. 16 and 17. It has been found that the edge 10 of the field oxide having the desired initial thickness as shown in FIG. 17 has a very smooth surface. After the silicon nitride 6 and the layer of silicon oxynitride 7 have been removed from the oxidation mask and after the bird's beak 11 has been removed, the field oxide 8 has the outer appearance outlined in FIG. 18. Such a structure is particularly suitable for isolation in semiconductor circuits having submicron dimensions. The structure is very flat, while the isolation thickness is substantially constant, viewed over the whole field oxide. The transition from the gate oxide 12 to the field oxide 8 is very smooth in this case.

Preferably, a silicon oxide layer is provided as planarizing auxiliary layer by heating the wafer in an atmosphere containing tetra ethoxy silane (Si(OC$_2$H$_5$)$_4$). Such a layer excellently fills gaps and can be readily etched with the same etching plasma as that with which a part of the field oxide 8 is removed.

The etching treatment with reactive ions is preferably carried out in a usual reactor (not shown) comprising parallel plates, one of which is grounded, while the other plate is connected to the supply source, by which a plasma is produced between the plates. The wafer is provided on the grounded plate. The plasma is produced in a gas mixture of tetrafluoromethane (CF$_4$) and argon passed between the plates. The gas pressure in the reactor is about 150 Pa, while the wafer is kept at room temperature. Thus, the layer of field oxide 8 formed during the oxidation treatment can be etched back to the desired initial thickness without the differences in etchability described above caused by stresses occurring. Moreover, it is thus achieved that, viewed over the whole wafer, the etching treatment is effected with a sufficient homogeneity and that during the step of etching the field oxide to the desired initial thickness the layer of silicon nitride 6 and the layer of silicon oxynitride 7 are also removed from the oxidation mask 3. Thus, the situation indicated in FIGS. 14 and 17 is obtained, but without the layers 6 and 7. If, as described above, the layer of silicon nitride 6 and the layer of silicon oxynitride 7 are not etched away until the initial thickness of the field oxide 8 is attained, of course the fact should be taken into account that, when the layers are etched away, the field oxide can also be slightly attacked. The initial thickness will then have to be slightly larger than in the case in which the layers 6 and 7 are removed during the removal of the additional thickness (comprising stress regions) of the field oxide.

Figure 3:
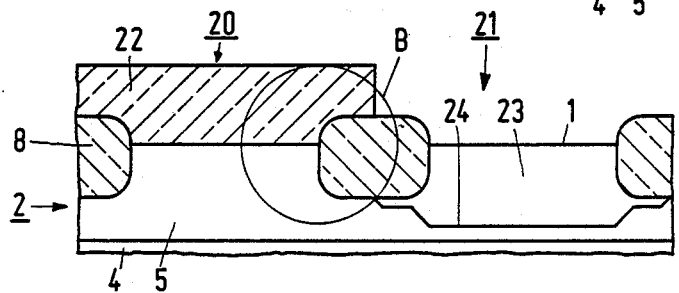

FIG. 3 shows the wafer 2 with the oxidation mask 3 being etched away. The part enclosed by the circle B then has the shape of the field oxide shown in FIG. 14 or 17. The thickness of the field oxide 8, which amounted to 800 nm after the oxidation treatment, then has become about 650 nm. Thus, parts of the epitaxial layer 5 enclosed by field oxide regions 8 are exposed, two of these regions being shown in the Figures by way of example. The method is shown hereinafter so as to be limited to these regions. However, in a semiconductor device a large number of such regions will be present.

The region 20 of the top layer 5 is covered in a usual manner by a layer of photoresist 22, which extends as far as above the field oxide 8 adjoining the region. By implatation of phosphorus ions having a dose of $10^{12}$ ions per cm$^2$ and an energy of 800 keV, a zone 23 of the n-conductivity type is formed, which has a maximum doping indicated diagrammatically by a line 24, which is located in the region 21 at a depth of about 800 nm and due to the thickness of 650 nm of the field oxide at this moment just adjoins the field oxide 8 at the area of this adjacent field oxide. Since the maximum doping of the zone 23 is not located at the surface 1 of the layer 5, the zone designated as a "retrograde well" in this case becomes an "N well".

Figure 4:
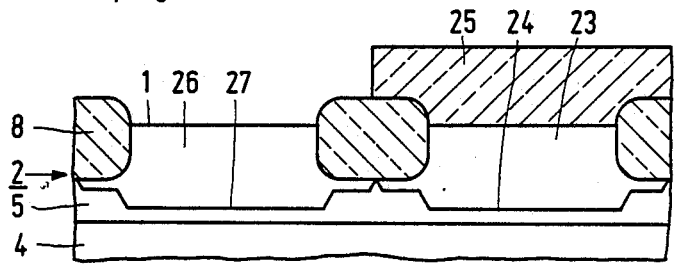
Figure 5:
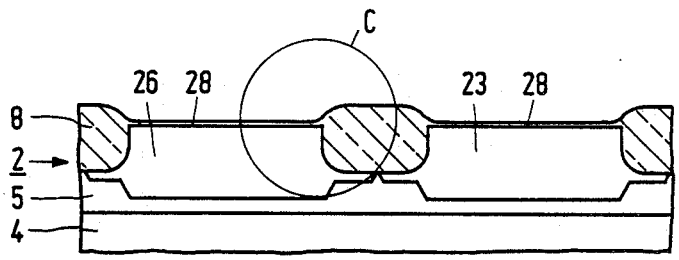

Subsequently, there is formed in FIG. 4 in the same manner by means of a photoresist mask 25 covering the region 21 and by means of an implatation of boron ions having a dose of $10^{12}$ ions per cm$^2$ and an energy of 350 keV a "P retrograde well" 26 having a maximum doping indicated by a line 27, which is also located at a depth of about 800 nm under the surface 1.

Now, as described above, the bird's beak 11 of the field oxide 8 is removed in a solution of hydrofluoride. The part enclosed by the circle C of FIG. 5 then has the shape shown in FIG. 15 or in FIG. 18.

The initial thickness of the field oxide thus has been chosen to realize the above mentioned retrograde wells and to compensate for losses during removal of the birds beak.

Figure 6:
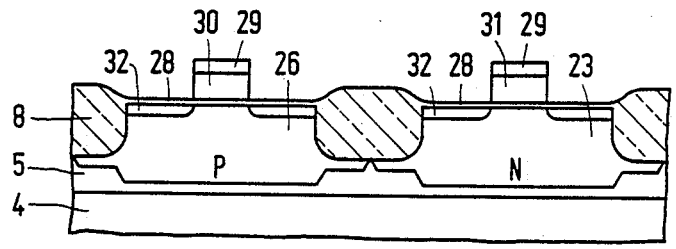
Figure 7:
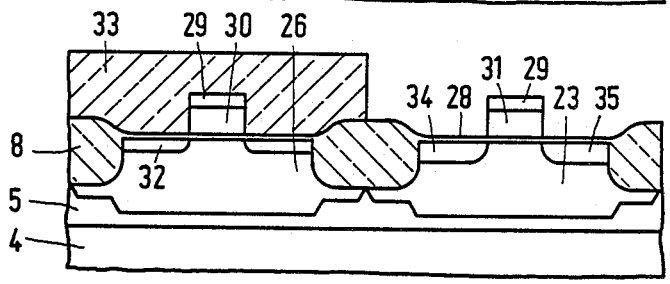
Figure 8:
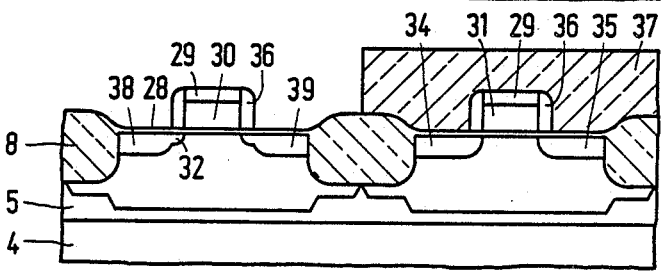
Figure 9:
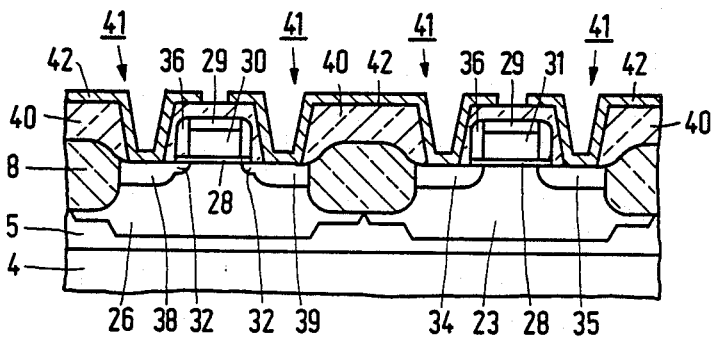

After a thin layer of gate oxide 28 having a thickness of about 20 nm has been provided—by heating the wafer for about 30 minutes in oxygen to about 925° C.—, gate electrodes 30 and 31 covered by an oxide layer 29 are provided in FIG. 6 in a usual manner. The field oxide 8 now has reached the desired isolation thickness of about 500 nm. Subsequently, an implantation with phosphorus ions having an energy of 50 keV and a dose of $10^{13}$ ions per cm$^2$ is carried out, in which lightly doped zones 32 are formed. After a photoresist mask 33 has been provided in FIG. 7, an implantation with BF$_2$+ ions is carried out having an energy of about 55 keV and a dose of $2 \times 10^{15}$ ions per cm$^2$. In the "N retrogade well" a source zone 34 and a drain zone 35 are thus formed.

After removal of the photoresist mask 33, the whole wafer is covered with an oxide layer having a thickness of about 300 nm, which is etched away by means of an anisotropic etching treatment in such a manner that at the area of the gate electrodes 30 and 31 spacers 36 are formed. After a photoresist mask 37 has been provided, a source zone 38 and a drain zone 39 are formed by means of an implatation with arsenic ions having an energy of 50 keV and a dose of $10^{15}$ ions per $cm^2$. Below the spacers 36 of the gate electrode 30, the lightly doped zones 32 are then still present, of which the part located beside the spacers 36 has passed into the source zone 38 and the drain zone 39 (see FIG. 8).

After removal of the photoresist layer 37, the gate oxide 28 above the source and drain zones 34, 35, 38 and 39 is etched away in a solution of hydrofluoride.

The wafer is finally covered with an isolating layer of silicon oxide 40 having contact holes 41, on which in a usual manner a metallization 42 is formed, which is in contact through contact holes 41 with the various semiconductor zones 34, 35, 38 and 39.

What is claimed is:

1. In a method of manufacturing a semiconductor device including the steps of
    locally providing an oxidation mask on a surface of a silicon wafer, and
    thereafter subjecting said silicon wafer to an oxidation treatment to form a layer of field oxide at parts of said surface free of said oxidation mask, said layer having a first thickness equal to a required isolation thickness plus an additional thickness,
    the improvement comprising the steps of
    initially forming said layer of field oxide to a second thickness at least 100 nm larger than said first thickness and at most 250 nm larger than said first thickness, and
    thereafter etching said silicon wafer with a reactive ion plasma to reduce said second thickness to said first thickness,
    wherein edges of said layer of field oxide are maintained to eliminate failure of isolation regions.

2. A method according to claim 1 wherein, before said step of etching, a planarizing auxiliary layer is formed over said silicon wafer including said layer of field oxide at said second thickness, and wherein said planarizing auxiliary layer is removed upon said step of etching.

3. A method according to claim 2, wherein said planarizing auxiliary layer is formed of silicon oxide by heating said silicon wafer in an atmosphere containing tetraethoxy silane.

4. A method according to claim 2, wherein said step of etching in a reactive ion plasma is carried out in a parallel plate reactor having one plate connected to ground and another plate connected to a supply source, wherein said silicon wafer is provided on said one plate connected to ground, and wherein said reactive ion plasma is produced between said plates in a gas mixture of tetrafluoromethane ($CF_4$) and argon passed between said plates.

5. A method according to claim 1, wherein said step of etching in a reactive ion plasma is carried out in a parallel plate reactor having one plate connected to ground and another plate connected to a supply source, wherein said silicon wafer is provided on said one plate connected to ground, and wherein said reactive ion plasma is produced between said plates in a gas mixture of tetrafluoromethane ($CF_4$) and argon passed between said plates.

6. A method according to claim 1, wherein said layer of field oxide is etched homogenously, said second thickness preventing accelerated etching of edge portions of said layer of field oxide.

7. A method according to claim 1, wherein stresses at edges of said layer of field oxide are superficial, said second thickness enabling removal of said stresses upon etching said second thickness.

8. A method according to claim 1, wherein superficial stresses at edges of said layer of field oxide are removed by reactive ion etching said second thickness to said first thickness.

* * * * *